US005554870A

United States Patent [19]

Fitch et al.

[11] Patent Number: 5,554,870

[45] Date of Patent: Sep. 10, 1996

[54] INTEGRATED CIRCUIT HAVING BOTH VERTICAL AND HORIZONTAL DEVICES AND PROCESS FOR MAKING THE SAME

[75] Inventors: Jon T. Fitch; Suresh Venkatesan; Keith E. Witek, all of Austin, Tex.

[73] Assignee: Motorola, Inc., Schaumburg, Ill.

[21] Appl. No.: 510,329

[22] Filed: Aug. 2, 1995

Related U.S. Application Data

[63] Continuation of Ser. No. 191,693, Feb. 4, 1994, abandoned.

[51] Int. Cl.$^{6}$ .......................... H01L 21/265; H01L 21/70

[52] U.S. Cl. .......................... 257/334; 257/329; 257/347; 257/350

[58] Field of Search .................................... 257/331, 135, 257/330, 329, 334, 347, 350, 351

[56] References Cited

U.S. PATENT DOCUMENTS

| | | | |
|---|---|---|---|
| 4,760,036 | 7/1988 | Schubert | 437/90 |
| 4,799,095 | 1/1989 | Baliga | 257/135 |
| 4,829,016 | 5/1989 | Neudeck | 437/31 |
| 4,851,362 | 7/1989 | Suzuki | 437/31 |
| 5,208,172 | 5/1993 | Fitch et al. | 437/40 |
| 5,252,849 | 10/1993 | Fitch et al. | 257/329 |
| 5,285,093 | 2/1994 | Lage et al. | 257/332 |
| 5,286,996 | 2/1994 | Neudeck et al. | 257/586 |
| 5,308,778 | 5/1994 | Fitch et al. | 437/40 |
| 5,308,782 | 5/1994 | Mazure et al. | 437/52 |
| 5,340,754 | 8/1994 | Witek et al. | 437/32 |

FOREIGN PATENT DOCUMENTS

| | | | |
|---|---|---|---|
| 2089118 | 6/1982 | United Kingdom | 257/331 |

OTHER PUBLICATIONS

J. A. Friedrich et al., "Interface Characterization of Silicon Epitaxial Lateral Growth over Existing SiO2 for Three–Dimensional CMOS Structures", IEEE Electron Dev. Ltrs., vol. 10, No. 4, Apr. '89, pp. 144–146.

K. Sunouchi et al., "A Surrounding Gate Transistor(SGT-)Cell for 64/256Mbit DRAMs", 1989 IEEE, IEDM pp. 23–25.

Peter J. Schubert et al., "Confined Lateral Selective Epitaxial Growth of Silicon for Device Fabrication", IEEE Electron Device Letters, vol. 11, No. 5, May 1990, pp. 181–183.

G. W. Neudeck et al., "Three Dimensional Devices Fabricated by Silicon Epitaxial Lateral Overgrowth", Journal of Electronic Materials, vol. 19, No. 10, 1990, pp. 1111–1117.

Peter J. Schubert et al., "Vertical Bipolar Transistors Fabricated in Local Silicon on Insulator Films Prepared Using Confined Lateral Selective Epitaxial Growth (CLSEG)", IEEE Transactions on Electron Devices, vol. 37, No. 11, Nov. 1990, pp. 2336–2342.

*Primary Examiner*—Donald L. Monin, Jr.
*Attorney, Agent, or Firm*—Patricia S. Goddard

[57] ABSTRACT

An integrated circuit (10) has a vertical device, such as a transistor (71), formed by epitaxial growth from a substrate (12) and a horizontal device, such as a transistor (73, 75) grown epitaxially from the vertical device. In accordance with one embodiment of the invention, all six transistors of an SRAM cell can be formed in single crystal material for improved device characteristics and increased cell density. Utilization of various combinations of vertical and horizontal devices permits a large degree of vertical integration within semiconductor devices.

22 Claims, 6 Drawing Sheets

INTEGRATED CIRCUIT HAVING BOTH VERTICAL AND HORIZONTAL DEVICES AND PROCESS FOR MAKING THE SAME

CROSS-REFERENCE TO RELATED APPLICATIONS

This application is a continuation of prior application Ser. No. 08/191,693, filed Feb. 4, 1994, now abandoned.

The present application is related to the following, commonly assigned co-pending applications:

1) "A Method For Forming Compact Logic Gates Using Vertical Transistors," by Jon T. Fitch et al, Ser. No. 08/003,813, filed Jan. 11, 1993, now U.S. Pat. No. 5,308,778, issued May 3, 1994, and herein incorporated by reference; and 2) "A Method for Forming a Vertically Integrated Memory Device," by Carlos Mazure et al., Ser. No. 07/966,643, filed Oct. 26, 1992, now U.S. Pat. No. 5,308,782, issued May 3, 1994.

3) "A Method for Forming a Transistor Having a Dynamic Connection Between a Substrate and a Channel Region," by Keith E. Witek et al., Ser. No. 07/940,260, filed Sep. 2, 1992, now U.S. Pat. No. 5,340,754, issued Aug. 23, 1994.

FIELD OF THE INVENTION

The present invention relates to integrated circuits in general, and more specifically to integrated circuits having both vertical and horizontal devices, and processes for making such integrated circuits.

BACKGROUND OF THE INVENTION

Planar or horizontal transistors are often used to fabricate integrated circuits (ICs). A planar transistor has a diffused source electrode and a drain electrode separated by a channel region. Overlying the channel region is a gate electrode that is separated from the channel region by a gate dielectric, which is typically a gate oxide. Planar transistors, although used and useful in many IC applications, are substrate area intensive and consume a large amount of substrate per transistor. In addition, with IC geometries decreasing into sub-micron ranges, planar transistors have various disadvantages. At smaller geometries and thinner gate oxide thicknesses, well documented problems such as hot carrier injection, leakage currents, isolation, short channel behavior, and channel length variations are major problems in planar transistors.

To overcome some of the disadvantages described above for planar transistors, elevated source and drain transistors, lightly doped drain (LDD) transistors, and other improvements were developed. Although the improvements reduced some of the disadvantages listed above, the improvements had some undesirable characteristics. The primary undesirable characteristic is the fact that the improved transistors were, in most cases, as area intensive or more area intensive than the planar transistor.

Various approaches have been used to try to reduce transistor surface area and increase transistor racking density by utilizing vertically oriented devices, while at the same time reducing some of the adverse effects described above. The surrounding gate transistor (SGT) was developed wherein a spacer gate and planar diffusions are used to form a transistor. The SGT reduced some of the disadvantages that affect planar transistors, and reduced surface area due to a vertically positioned spacer gate. Topography problems and the geometry of the SGT usually result in source and drain contacts that are difficult to achieve and are difficult to consistently produce using submicron technology. In addition, doping of source regions, drain regions, and channel regions via implants can be difficult due to geometry and may require special processing.

In order to further increase circuit density, the thin film transistor (TFT) has been developed, especially for memory applications. TFTs have been designed in both horizontal and vertical orientations to meet the needs of a particular application or layout constraint of, for instance, a memory cell. Although small memory cell areas can result from the use of TFTs, TFTs are highly resistive and therefore not adequate for all applications.

Despite the efforts that have been made in the area of three-dimensional integration of circuits, there continues to be a need for improvements. Examples of desired improvements include shorter interconnection distances between individual devices within the IC and reduced contact resistance of contacts made between individual devices or interconnections.

SUMMARY OF THE INVENTION

In one form of the invention, an integrated circuit includes a semiconductor substrate having a first active area formed of a single crystal semiconductor material. A vertical device having a second active area is connected to the first active area of the substrate. The second active area has a first electrode. A horizontal device which is removed from the substrate, but connected to the substrate by the vertical device, has a third active area and a second electrode. The first and second electrodes are formed of a continuous single crystal semiconductor layer of the semiconductor material. The first and second electrodes are connected to each other, and are of the same conductivity type. Another form of the present invention is a method of making such an integrated circuit.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

FIG. 10 is a cross-sectional view taken along the line 10—10 of FIG. 11.

DETAILED DESCRIPTION OF A PREFERRED EMBODIMENT

The present invention improves device packing density in integrated circuits (ICs) by forming both a vertical device and a horizontal device from the same single crystal material, such as epitaxial silicon. The devices are merged so as to eliminate the need for interconnects or separate contacts. Thus, problems associated with contact resistance and long interconnect lines are mitigated.

Figure 1:
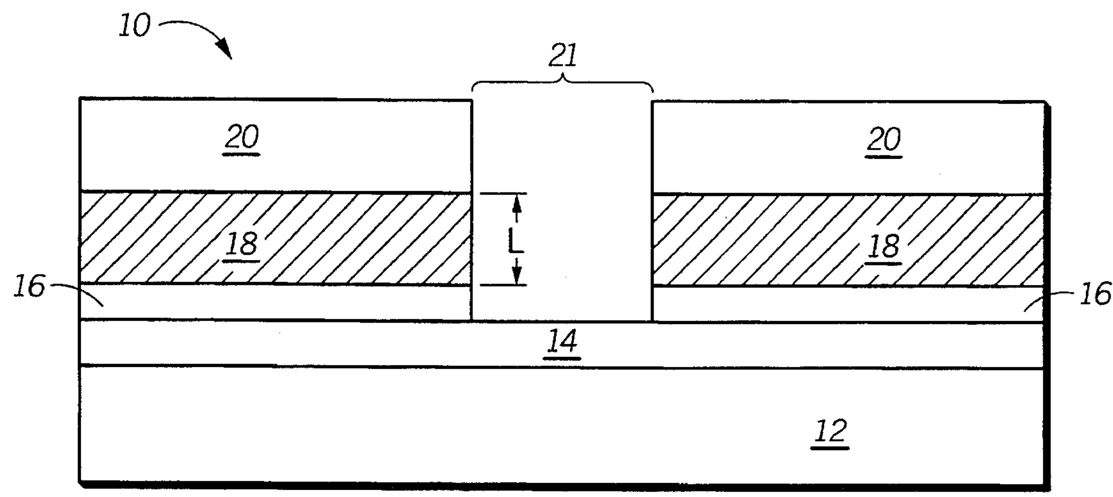
FIGS. 1–10 each illustrate a cross-sectional view of a portion of an IC formed in accordance with the present invention. These figures depict an example of sequential processing steps used to make the device.

Illustrated in FIG. 1 is a structure suitable to begin forming an integrated circuit 10 in accordance with the present invention. The method for forming an IC illustrated in FIGS. 1–10 demonstrates forming a vertical transistor and a horizontal transistor of a continuous single crystal material. However, it is to be understood that other devices, such as capacitors and resistors, can likewise be formed and are still within the scope of the present invention.

The portion of IC 10 illustrated in FIG. 1 has a substrate 12 having a surface and having a first conductivity type. Substrate 12 may be made of silicon, gallium arsenide, silicon on sapphire, epitaxial formations, germanium, germanium silicon, and/or like substrate materials. Preferably, the substrate 12 is made of silicon. A doped region 14 of a second conductivity type, opposite the first conductivity, is formed within the substrate 12. In the view of FIGS. 1–10, it appears that doped region 14 exists across the entire upper surface of substrate 12, but as will become evident from FIG. 12, and as one of ordinary skill would appreciate, doped region 14 may be formed in selected regions of the substrate. The doped region 14 can be implanted or diffused into desired portions of the substrate selectively through the use of one of a photoresist mask, an oxide mask, a nitride mask or the like. Doped region 14, in a similar manner, can be implanted through an oxide or like material to ensure an appropriate dopant-dispersed junction. A first dielectric layer 16 is formed overlying the substrate 12 and overlying the doped region 14. A control electrode conductive layer 18 is formed overlying the dielectric layer 16. In a preferred form, conductive layer 18 is polysilicon, but conductive layer 18 may be a metal, a salicide or silicide, germanium silicon, or the like. A second dielectric layer 20 is formed overlying the conductive layer 18.

The dielectric layers 16 and 20, and all other dielectrics described herein may vary in physical and chemical composition based upon the function they perform. The dielectric layers described herein may be wet or dry silicon dioxide (SiO2), nitride, tetra-ethyl-ortho-silicate; (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride (PEN $SiN_x$) and/or the like. Specific dielectrics are noted where a specific dielectric is preferred or required.

A masking layer of photoresist (not shown) is deposited overlying the dielectric layer 20. The masking layer is conventionally patterned and etched to form a mask opening that exposes a portion of the dielectric layer 20. A portion of the dielectric layer 20 is etched selective to the conductive layer 18 to form an opening in the dielectric layer 20. A portion of the conductive layer 18 is etched selective to the dielectric layer 16 to deepen the opening by etching into conductive layer 18. A portion of the dielectric layer 16 is etched selective to the doped substrate region 14 to further deepen the opening by etching into dielectric layer 16. The etching of dielectric layer 16 exposes the surface of the doped substrate region 14. The etching of the dielectric layers 20 and 16 and conductive layer 18 results in an opening 21 that is self-aligned to the mask opening. The opening is sometimes referred to as a device opening due to the fact that the opening is used to form transistor devices, and the like. It should be noted that non-selective etches and multiple etch processing steps are possible for the formation of the device opening.

Figure 2:
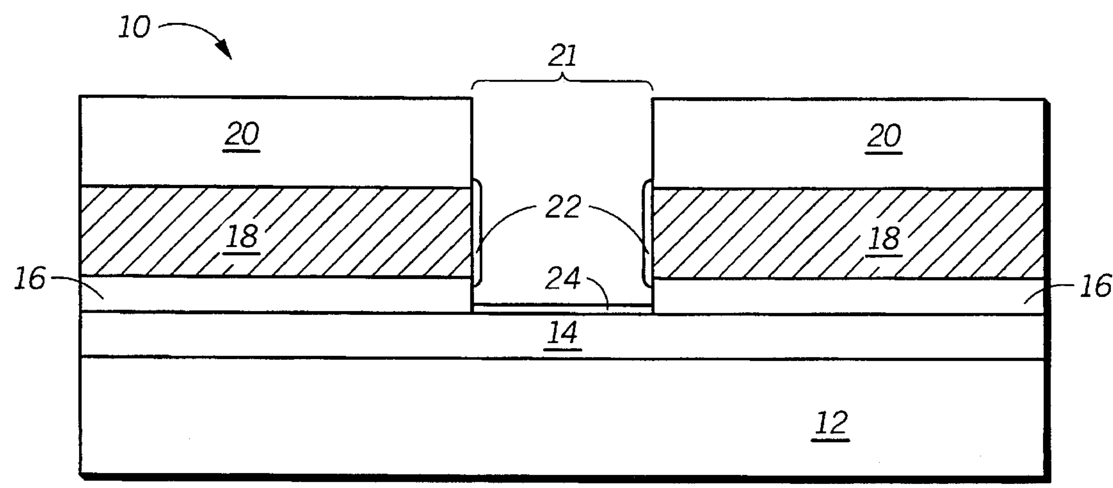
Figure 3:
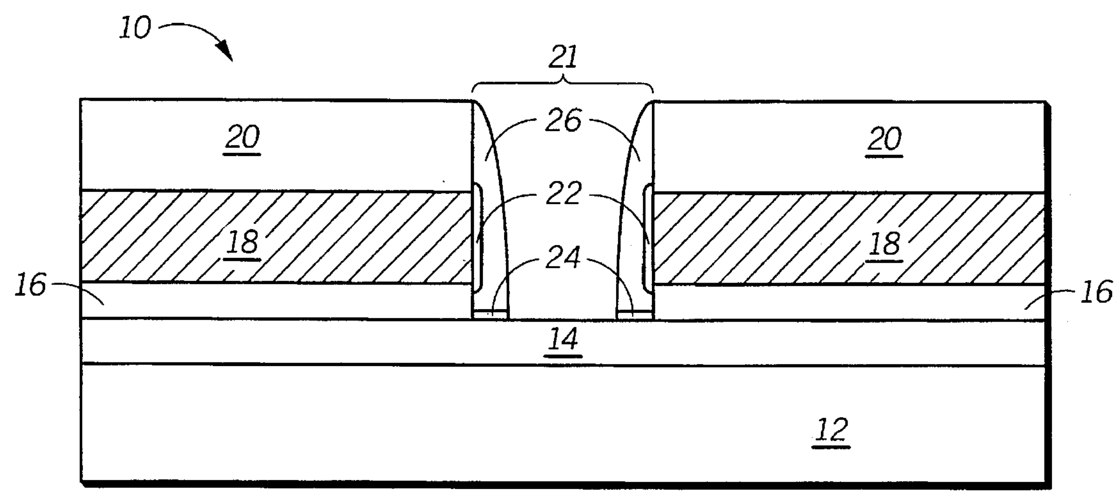

FIG. 2 illustrates one suitable method for forming a sidewall dielectric layer 22 within device opening 21. Sidewall dielectric layer 22 is formed on a sidewall of the conductive layer 18 that results from the formation of the opening. Due to the fact that the dielectric functions as a gate dielectric, the dielectric layer 22 is in most cases a high quality grown SiO2 layer, or a CVD stacked dielectric layer comprised of a grown SiO2 layer and a deposited TEOS layer, or the dielectric layer is a thin deposited TEOS layer alone. The growth of dielectric layer 22 will result in a thin dielectric layer 24 being grown on the exposed surface of the doped region 14. In another form, the dielectric layer 22 could be formed via deposition or spacer technology. The formation of the dielectric layer 24 is a side-effect that is undesirable for purposes of the present invention. Therefore, FIG. 3 illustrates a dielectric removal step for a portion of the dielectric layer 24. A spacer 26 or like formation is formed overlying the dielectric layer 24 and adjacent the dielectric layer 22. Preferably, the spacer 26 is nitride. The spacer 26 is used to protect the dielectric layer 22 from subsequent oxide etching. An oxide etch is then performed selective to nitride spacer 26 and substrate 12. The oxide etch removes a portion of dielectric layer 24 that lies within an inner portion of the device opening, as illustrated in FIG. 3. The inner portion of the device opening is defined by the dielectric spacer 26. A portion of the dielectric layer 24 which underlies the spacer and surrounds a periphery of the opening remains unetched. The spacer 26 is then removed via conventional nitride or removable spacer techniques. Optionally, the spacer 26 is left on the sidewall and functions as a sidewall gate dielectric.

Figure 4:
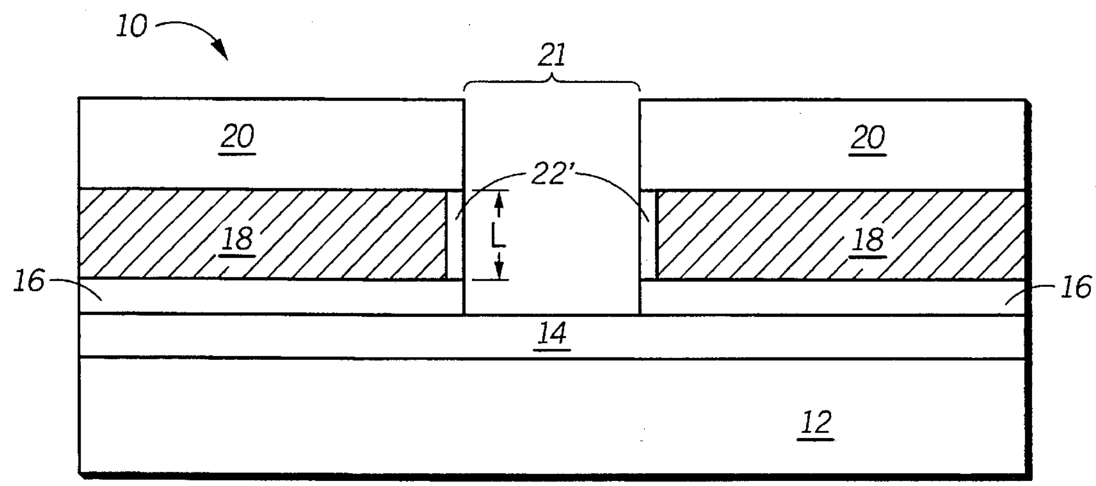

In FIG. 3, the dielectric layer 24 that remains around a periphery of the device opening is not desirable, especially during subsequent epitaxial growth and if spacers 26 are removed. Therefore, FIG. 4 illustrates an alternative method that may be used to replace the steps of FIGS. 2–3. When etching the dielectric layers 16 and 20 and the conductive layer 18 to form the opening 21, a dielectric layer 20 etch followed by a conductive layer 18 etch, followed by a dielectric layer 16 etch is used to expose the substrate 12 and self-align various features of IC 10. If during the conductive layer 18 etch an over-etch or isotropic etch is performed, the conductive layer 18 will laterally etch and recess into a "cave" having sides defined by the dielectric layers 16 and 20. With a conductive layer 18 that is recessed from a sidewall of the opening, a dielectric layer 22' can be formed as illustrated in FIG. 4. The formation of the dielectric layer 22' also forms a surface dielectric layer (not illustrated but like dielectric layer 24 in FIG. 2) overlying the doped region 14. The difference between this method and the previously described method is that a spacer is not needed to protect the sidewall dielectric layer 22' during removal of any surface dielectric layer formed on substrate 12. A reactive ion etch (RIE) can be performed to completely remove the surface dielectric layer from the surface of the doped region 14 without affecting the recessed dielectric layer 22'. During RIE etching, plasma damage can result in a degraded dielectric layer 22'. Due to the fact that the dielectric layer 22' functions as a gate oxide, dielectric layer 22' must be of excellent quality. Therefore, to avoid or reduce plasma damage during RIE etching, the dielectric layer 22' is nitrided using $N_2$, $N_2O$, $NH_3$, or an equivalent. A nitrided oxide resists plasma damage and is a feasible option for dielectric layer 22' within IC 10.

Figure 5:
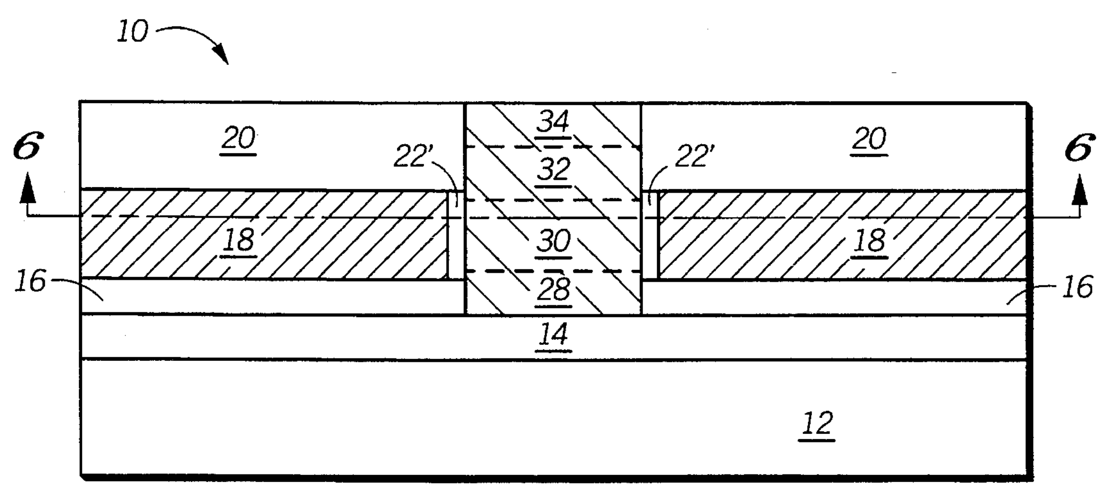

In FIG. 5, first and second current electrodes, also respectively referred to as a source and a drain, and a channel region are formed in the form of a vertical column. As mentioned above a vertical column as used in the present invention can be any device, but is illustrated in the form of a metal-oxide-semiconductor (MOS) field effect transistor. Other suitable devices include bipolar transistors, resistors, capacitors, or any active device. In a preferred form, a grown conductive region is used to form the first and second current electrodes and the channel region of a MOS transistor. Preferably, the grown conductive region is formed via epitaxial growth.

To form the vertical column by epitaxial growth, the surface of substrate 12 exposed within device opening 21 must be clean. A conventional RCA oxidizing clean, an Ishizaka-Shiraki clean, or an equivalent cleaning cycle, is suitable for cleaning the substrate surface. After cleaning, IC 10 is placed into a piece of equipment suitable for epitaxial growth. Growth is initiated by heating the IC and subjecting exposed portions of the doped region 14 or substrate 12 to a chemical compound such as dichloro-silane or a similar silicon source gas. Other gases, such as HCl and $H_2$ are also used to initiate and moderate the appropriate chemical reactions necessary for selective epitaxial growth. Temperature conditions within a reaction chamber may generally be 850°–950° C., and at a pressure of between 25–40 Torr. These epitaxial growth conditions are merely demonstrative, as it is recognized that other known epitaxial growth conditions and techniques are also suitable for use in practicing the present invention.

Initially, a first current electrode or source electrode 28 is formed in the device opening. Electrode 28 is formed of the second conductivity type that is opposite the first conductivity type. In order to dope the source electrode 28 with dopant atoms of the second conductivity type, in-situ doping is preferred although ion implantation is possible. In-situ doping means that the source electrode 28 is doped during growth by a dopant gas source. If the second conductivity type is P type, then a boron-containing gas or a like dopant gas is used to dope source electrode 28. If the second conductivity type is N type, then a phosphorus-containing, arsenic-containing, or like dopant gas is used to dope source electrode 28. Source electrode 28 is grown, with in-situ doping, until the electrode is adjacent or nearly adjacent a bottom portion of the sidewall dielectric 22'. Source electrode 28 is adjacent the first dielectric layer 16 as illustrated in FIG. 5. Alternatively, source electrode 28 may be formed by out-diffusing dopants from doped region 14, which would be of the same conductivity type as the source electrode.

Epitaxial growth continues in a similar manner to form a channel region 30. The channel region 30 is formed of the first conductivity type, preferably via in-situ doping as described herein. Due to the fact that dielectric layer 22' is a gate dielectric and that conductive layer 18 functions as a gate electrode, the doping in the channel region 30 can be used to adjust threshold voltages. The channel region 30 is grown, with in-situ doping, until the channel region 30 is adjacent or nearly adjacent a top portion of the sidewall dielectric 22' as illustrated in FIG. 5.

Epitaxial growth continues in a similar manner to form a second current electrode, also referred to as a drain electrode, of the second conductivity type. The second current electrode has a first sub-region referred to as a lightly doped electrode 32 and a second sub-region referred to as a heavily doped electrode 34. The electrodes 32 and 34 are formed by changing the in-situ doping concentration during growth. Initially, the second conductivity doping gas is at a predetermined concentration. After a predetermined time, and therefore after a predetermined thickness of the lightly doped electrode 32 has been achieved, the dopant concentration is increased to a second predetermined level and epitaxial growth continues to form the heavily doped electrode 34. Electrode 34 is grown, with in-situ doping, until the electrode is approximately level with dielectric layer 20. A portion of electrode 34 is adjacent the second dielectric layer 20 as illustrated in FIG. 5. Alternatively, second current electrode 34 can be formed by ion implantation after epitaxial growth to form the vertical active area.

Although IC 10 is illustrated as having a transistor with a half lightly doped drain (LDD) structure, such doping is not necessary for practicing the present invention. Rather, the source and drain regions may have constant doping levels throughout. Also, the source and drain electrodes of the vertical transistor can be interchangeable in the structure of FIG. 5, depending on the application. If the source and drain functionality is switched (i.e. the drain is formed underlying the channel region 30 and the source is formed overlying the channel region 30), an LDD electrode may be formed for the lower drain electrode. Furthermore, LDD regions can be formed in both electrodes of the transistor.

Either N-channel or P-channel transistors can be formed within the vertical column of IC 10. If the first conductivity is N type and the second conductivity is P type then a P-channel vertical transistor is formed. If the first conductivity is P type and the second conductivity is N type then an N-channel vertical transistor is formed.

Figure 6:
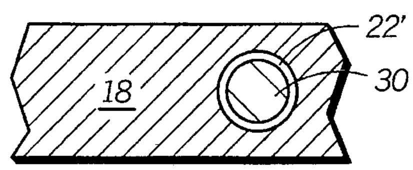

In most cases, the transistor of IC 10 of FIG. 5 will have a conductive layer 18 that completely surrounds the device opening. A maximum amount of current carrying capability, a more consistent aspect ratio (transistor width/length ratio), and reliable lithographic: alignment are advantages of having fully surrounded device openings. In FIG. 6, a top view taken along the horizontal line 6—6 of FIG. 5 is illustrated. Conductive layer 18, dielectric layer 22', and channel region 30 are illustrated. In FIG. 6, the conductive layer 18 is illustrated as completely surrounding the channel region 30. Dielectric layer 22' functions as a gate electrode dielectric.

After forming a vertical device, such as a transistor, as illustrated in FIGS. 1–5, a horizontal device is formed using a process referred to as confined lateral silicon epitaxial growth (CLSEG). As noted above, the single crystal material grown need not be silicon, although silicon is the most prevalent epitaxial material used in the semiconductor industry. A CLSEG technique as used is the present invention is generally described herein. More detailed explanations of CLSEG techniques may be found in a Doctoral Thesis by Peter J. Schubert, "Study of a New Silicon Epitaxy Technique: Confined Lateral Selective Epitaxial Growth", May 1990, Purdue University.

Figure 7:
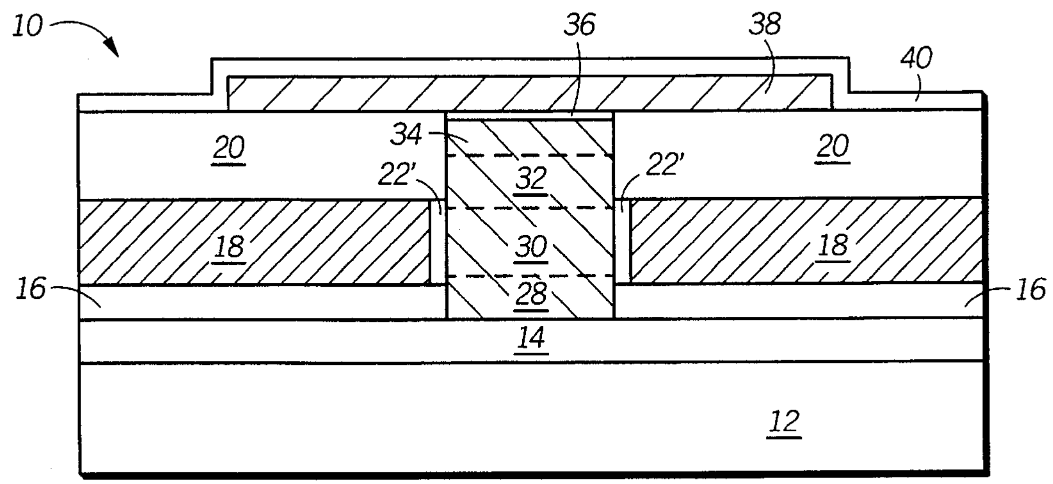

As illustrated in FIG. 7, a dielectric layer 36 is grown or deposited over electrode 34 of the vertical transistor. In a preferred embodiment, dielectric layer 36 is silicon dioxide, and more specifically deposited TEOS. If deposited, dielectric layer 36 will extend over most of the surface of IC 10, although not illustrated as such in FIG. 7. TEOS is preferred to reduce the overall thermal budget required for forming the device. The purpose of dielectric layer 36 is to protect the silicon on top of the vertical transistor from subsequent etch steps discussed below. Next a sacrificial layer 38 is deposited and patterned on the device. Sacrificial layer 38 should be patterned to be the desired pattern of an active area of the horizontal device to be formed. In a preferred embodiment, sacrificial layer 38 is amorphous silicon, for reasons addressed below, which can be deposited and patterned using known techniques.

Overlying sacrificial layer 38 is a capping layer 40. Capping layer 40 is deposited to completely cap the sacrificial layer 38, and may be blanketly deposited over the entire IC as illustrated in FIG. 7. Capping layer 40 is preferably of $Si_3N_4$. For reasons to become apparent below, the capping layer 40 must be able to withstand an etch which attacks sacrificial layer 38. If capping layer 40 is $Si_3N_4$ and sacrificial layer 38 is amorphous silicon, an intervening stress relief layer (not shown) between the capping layer and sacrificial layer may be desired as discussed below. Such an intervening layer may be, for example, an intervening oxide layer. If the capping layer is itself an oxide, an additional layer for stress relief is not necessary.

Figure 8:
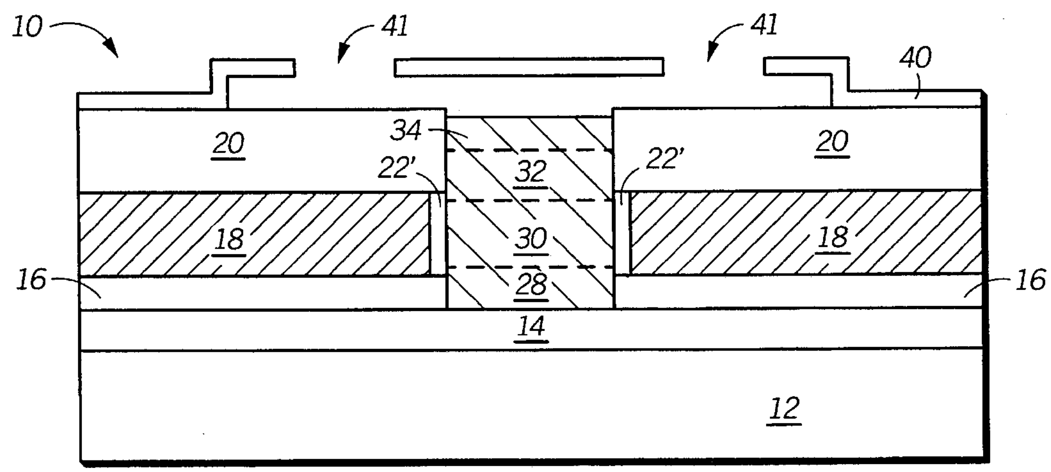

Next, openings 41 are formed in the capping layer 40 to expose portions of sacrificial layer 38. The size and number of openings 41 formed in capping layer 40 should be sufficient to allow removal of sacrificial layer 38 from under the capping layer, while permitting the capping layer to remain free-standing after removing the sacrificial layer, as illustrated in FIG. 8. Openings 41 may be formed in the capping layer using conventional lithography. A suitable etch to form the openings if capping layer 40 is $Si_3N_4$ and sacrificial layer 38 is amorphous silicon is an RIE etch chemistry of $CF_4$ or $CF_4$-$O_2$. In removing the sacrificial layer, dielectric layer 36 should also be removed, either in the same step or with an additional etch, to expose electrode 34 and provide a clean surface on the vertical column to allow further epitaxial growth. To remove an amorphous silicon sacrificial layer from under an $Si_3N_4$ capping layer, gaseous HCl or ethylene diamene pyrocatecol (EDP) etchants may be used. If the capping layer is an oxide or nitride, a liquid etch using ethylene-diamine-pyrocatechol (EDP) is suitable and preferred. A separate etching step is necessary to remove dielectric layer 36 from electrode 34 is a liquid EDP etch is employed. Dielectric layer 36 may be removed separately using an liquid or vapor HF etch if dielectric layer 36 is comprised of silicon dioxide.

With the foregoing description of the functions of each of dielectric layer 36, sacrificial layer 38, and capping layer 40 explained above, a better understanding of suitable materials for these layers can be given. Dielectric layer 36 serves to protect the vertical epitaxial column during an EDP etch used to remove an amorphous silicon sacrificial layer 38. Dielectric layer 36 is preferably an oxide because an oxide can be etched selectively to a nitride confinement structure (i.e. the capping layer 40). Other materials could be used for dielectric layer 36 provided one could etch dielectric layer 36 preferentially to the confinement structure material and to the vertical epitaxial column, which is likely to be of silicon. Other candidate materials for dielectric layer 36 include silicon nitride, aluminum oxide, germanium, silicon oxynitride, and tantalum pentoxide.

Amorphous silicon is preferred for use as sacrificial layer 38 because there is an etchant, EDP, which has very high selectivity to oxide and nitride (the preferred materials for dielectric layer 36 and capping layer 40, respectively). EDP also has a very high etch rate for the amorphous silicon which is important for etching the amorphous silicon out of very deep and narrow structures. Other sacrificial materials could be used, such as silicon nitride (which can be removed by hot phosphoric acid), plasma TEOS, germanium, and germanium dioxide (which can be removed with deionized water).

An optional stress relief layer was discussed above as being useful if capping layer 40 is nitride and sacrificial layer 38 is amorphous silicon. This is because silicon nitride and silicon have very different coefficients of thermal expansion. If a single crystal silicon layer is left in direct contact with a silicon nitride layer during heating or cooling, crystal defects are formed in the silicon. These defects contribute substantially to device leakage.

The free-standing confinement structure created by capping layer 40 illustrated in FIG. 8 is used to confine subsequent epitaxial growth which will occur laterally across the surface of dielectric layer 20, thus the phrase confined lateral silicon epitaxial growth (CLSEG). After exposing electrode 34 and providing a sufficiently clean surface on the electrode, epitaxial growth is again initiated under conditions described above or others known in the art for epitaxial growth. Epitaxial growth is continued until the grown material fills the area under capping layer 40. Once epitaxial growth is completed, capping layer 40 is removed selectively to the epitaxially grown material, for instance using the same etching method used to form openings 41. If the confinement structure is formed from silicon nitride, one could also use a hot phosphoric acid etch to preferentially remove the silicon nitride.

Figure 9:
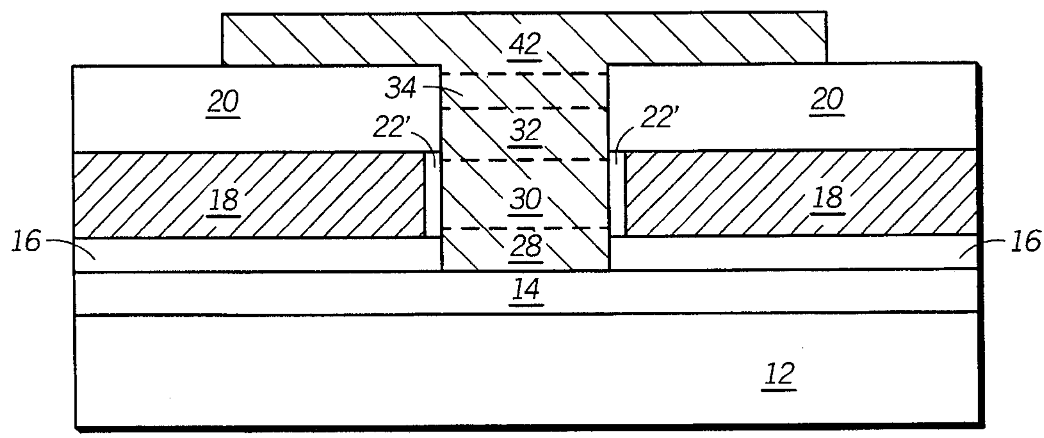

As illustrated in FIG. 9, the resulting structure is a horizontal active area 42 formed from the same continuous single crystal material as that used to form the active area of the vertical transistor. An "active area" is generally defined as the region of the device which is electrically active, or in other words the region(s) that form a junction, a depletion region, a channel region, or the like. Stated otherwise, active regions are current carrying regions of the device. Active area 42 can now be transformed into any desired active device, for example a transistor, as will be described in FIG. 10. Because active area 42, the active area of the vertical transistor, and the active area in the underlying substrate 42 are all single crystal material, and are continuous, devices formed in accordance with the present invention have the following advantages. From a performance point of view, devices formed of single crystal materials are vastly superior to polysilicon thin film transistors (TFTs). TFTs are workable but inferior to single crystal MOSFETs because grain boundaries in polysilicon TFTs degrade channel mobility and reduce the maximum current at which the device can switch. Also, there is typically a much larger voltage drop across a polysilicon TFT than a single crystal MOSFET. Polysilicon TFTs also have much higher leakage current levels in the off-state. This significantly increases the power consumption of a circuit, such as an SRAM. Moreover, polysilicon TFTs have high dopant diffusion, thereby requiring increased size to account for the diffusion and to offset the drain electrode. Offsetting current electrode implants also increases process complexity since an additional masking layer is needed. An advantage of the present invention over TFTs is that TFTs can only be used as load devices whereas single crystal devices in accordance with the present invention have more versatility (e.g. can be used as driver transistors, bipolar transistors, diodes, and the like). Other performance benefits are achieve with the present invention simply because area of an IC or cell within an IC is can be reduced by placing fewer and fewer of the transistors in the substrate. Also, since active areas of the vertical and horizontal device are continuous, there is no need to form interconnects or contacts between the two devices. Thus, packing density within the IC is significantly improved. Furthermore, interconnects and contacts require additional processing steps, increase device area, and degrade device performance due to contact resistance and signal delays.

Figure 10:
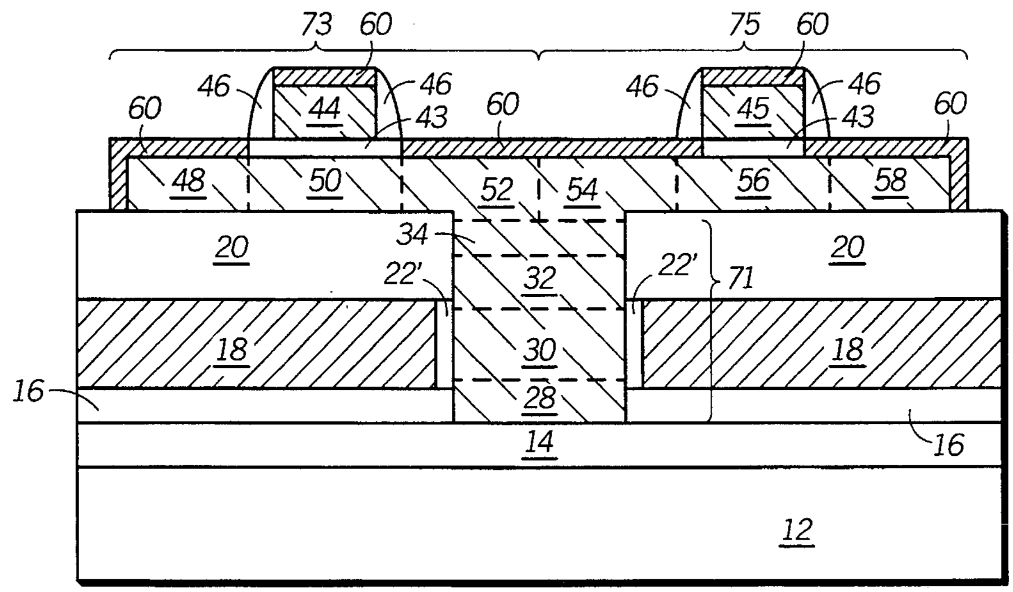
Figure 11:
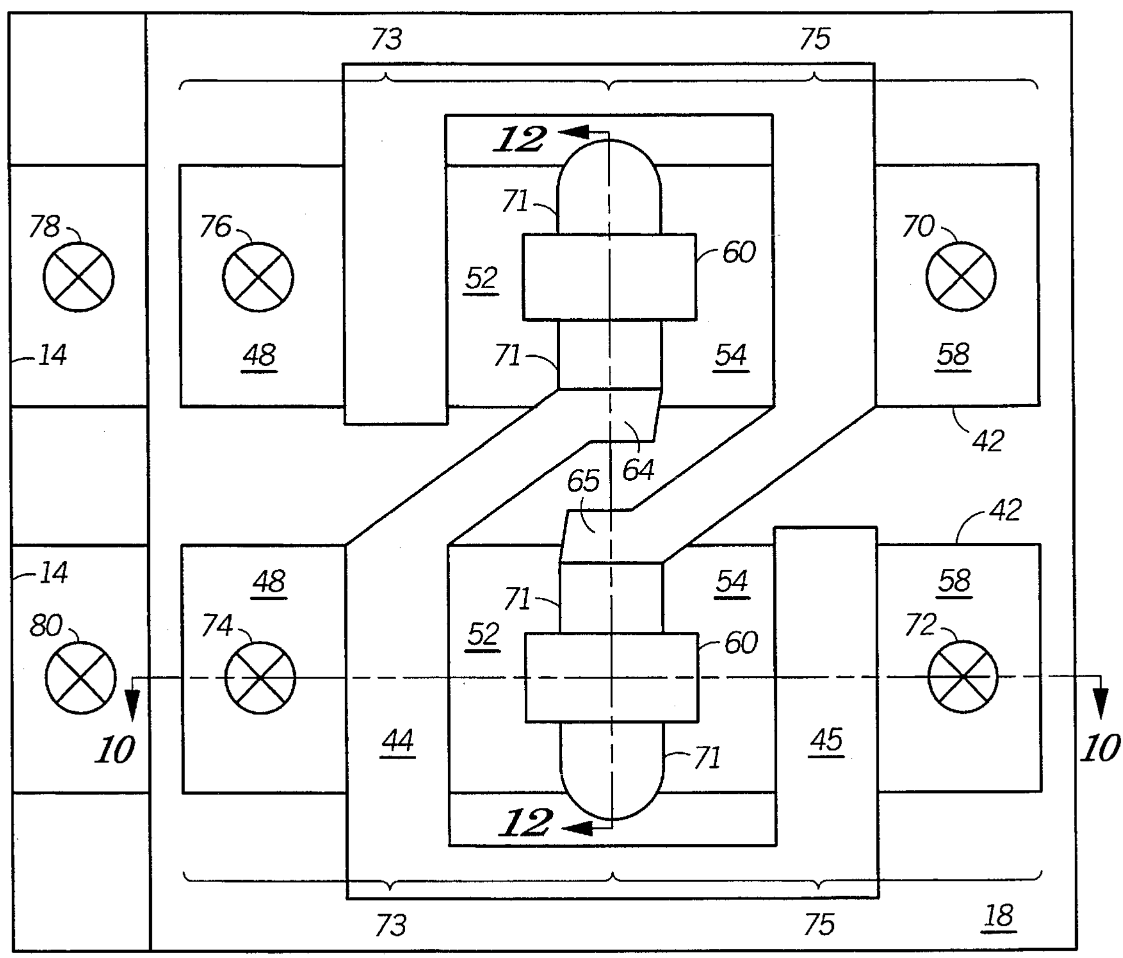
FIG. 11 is a layout of a static random access memory (SRAM) cell having vertical and horizontal devices (specifically transistors) therein, in accordance with one embodiment of the present invention.
Figure 12:
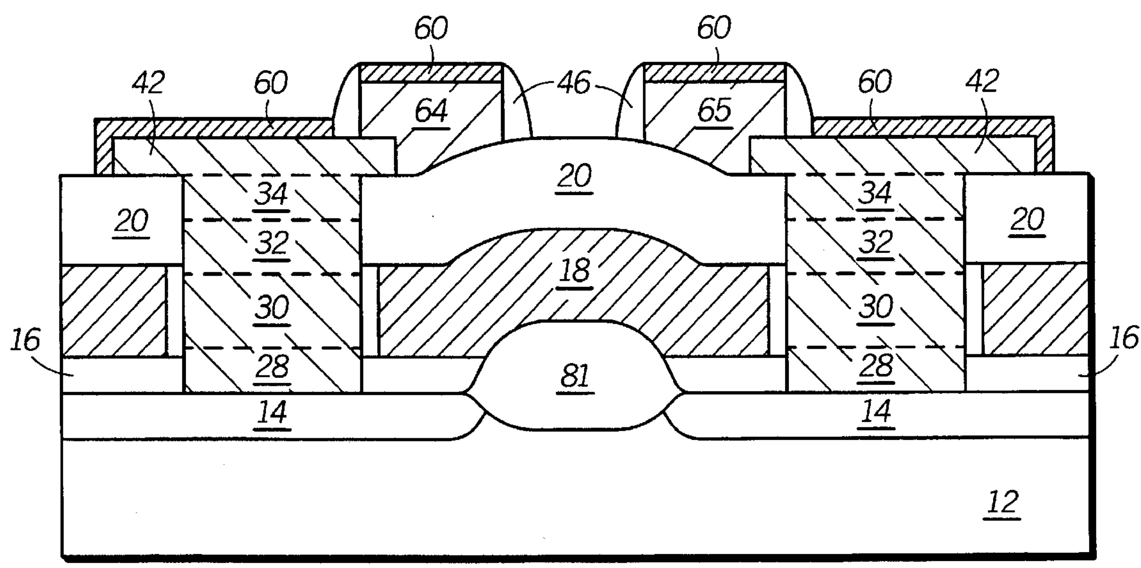
FIG. 12 is a cross-sectional view of the SRAM cell of FIG. 11 taken along the line 12—12.

FIG. 10 illustrates how active area 42 can be used as an active area for two horizontal transistors 73 and 75, as might be applicable in a six transistor SRAM cell. An SRAM cell layout incorporating vertical and horizontal transistors in accordance with the present invention is illustrated in FIG. 11. FIG. 10 is a cross-sectional view taken along the line 10—10 of FIG. 11. Similarly, FIG. 12 is a cross-sectional view of the SRAM cell taken along the line 12—12 in FIG. 11. As illustrated in FIG. 10, a gate dielectric layer 43 overlies a portion of the horizontal active area. Overlying gate dielectric layer 43 are two control or gate electrodes 44 and 45 of transistors 73 and 75, respectively. Within the SRAM cell, gate electrode 44 is a gate for a N-channel latch transistor 73 while gate electrode 45 is a gate electrode for a P-channel load transistor 75. The vertical transistors (compositely labeled 71) in the SRAM cell are N-channel pass transistors, wherein conductive layer 18 is the gate electrode of the pass transistors and is coupled to the cell's word line(s) in accordance with a conventional SRAM circuit. Adjacent gate electrodes 44 and 45 are sidewall spacers 46 formed in accordance with conventional processing. The horizontal active area itself is doped appropriately to form regions 48, 50, 52, 54, 56, and 58. Regions 50 and 56 are channel regions underlying gate electrodes 44 and 45, respectively and underlying dielectric layer 43. As channels of the transistor, the regions 50 and 56 are undoped or very lightly doped regions of the single crystal material, as compared to the dopant concentrations of regions 48, 52, 54, and 58. On opposing sides of and adjacent channel region 50 are doped regions 48 and 52. In one embodiment, gate electrode 44 is a gate of a N-channel device, thus regions 48 and 52 are of N-type conductivity. On opposing sides of and adjacent channel region 56 are doped regions 54 and 58. In one embodiment, gate electrode 45 is a gate of a P-channel device, thus regions 54 and 58 are of P-.type conductivity. Since adjacent regions 52 and 54 are of opposite conductivity, it may be desirable to electrically short-circuit the two regions if a diode voltage drop is to be avoided. Accordingly, exposed portions of horizontal active area 42 are salicided (a self-aligned silicidation process) to form silicide or salicide regions 60. As a result of the silicidation process, the upper surfaces of gate electrodes 44 and 45 are also salicided unless there is an overlying capping layer. As illustrated by FIG. 10, heavily doped current electrode 34 of the vertical transistor is directly connected to a current electrode of each of the horizontal transistors. In the instance where current electrode 34 and either of doped regions 52 or 54 are of the same conductivity type, a voltage on current electrode 34 will be substantially equal to the voltage on the doped region of the same conductivity type.

Processing steps to transform the structure illustrated in FIG. 9 to that illustrated in FIG. 10 may be as follows. All of these steps are individually known and understood in the art, therefore a detailed description is unnecessary. Furthermore, other methods of achieving the structure than those now described may be used and are also within the scope of the present invention. After removing the capping layer 40 from active area 42, a thermal oxide is grown to form dielectric layer 43. Next, a polysilicon or other conductive layer is deposited and patterned to form gate electrodes 44 and 45. The gate electrodes may include silicide regions, overlying dielectric caps, or anti-reflective coatings such as silicon nitride (none of which are illustrated). Spacers 46 are next formed in a conventional manner by conformally depositing a blanket layer of dielectric material, such as $Si_3N_4$, which is anisotropically etched selective to underlying dielectric layer 43. Next, the doping is performed by ion implantation through dielectric layer 43 or other known technique to form doped regions 48, 52, 54, and 58. In one embodiment where regions 48 and 52 are to be doped of opposite conductivity than regions 54 and 58, one half of the horizontal active area can be masked, while the exposed half is implanted with the desired type of impurities. Then, the masking is reversed to enable implantation in the remaining half of the cell. Dielectric caps (not shown) may be formed over gate electrodes 44 and 45 to protect the gates from being doped and to electrically isolate the gates from any subsequently deposited conductive layers. Sidewall spacers 46 which are next to the gate electrodes make doped regions 48, 52, 54, and 58 self aligned. If desired, LDD regions, such as those described above and those known in the art, may also be included in one or both of the horizontal transistors illustrated in FIG. 10. After forming the doped regions, dielectric layer 43, other than where masked by gate electrodes 44 and 45 and spacers 46, is removed to expose the single crystal active area. Salicide regions 60 are formed on all exposed silicon and polysilicon areas using a know salicidation process. As an alternative a salicide process, a strap (such as a silicide strap) an opening in dielectric layer 43 to expose only regions 52 and 54. The exposed doped regions are then silicided by, for example, depositing a refractory metal and reacting the metal with the single crystal material which forms the horizontal active area. Unreacted portions of the refractory metal are then removed, leaving a silicide strap (not shown). Formation of a strap requires an masking step, whereas a salicide process does not. However, either alternative is suitable in practicing the present invention.

An SRAM cell having the two horizontal transistors and one vertical transistor illustrated in FIG. 10 is illustrated in a layout view in FIG. 11, with corresponding elements being labeled the same in each of the views. In all, the cell has six transistors, two vertical transistors 71 grown epitaxially using the substrate as a seed and four horizontal, silicon-on-insulator transistors 73 and 75 grown from the vertical transistors using CLSEG. In operation, the two vertical transistors are pass transistors, while the four horizontal transistors include two latch transistors and two pull-up or load transistors, in accordance with a conventional six transistor SRAM circuit.

In FIG. 11, the two vertical transistors are compositely labeled 71, and are formed in the manner described above. A source region of each vertical transistor 71, in other words the bottom most doped region, is connected to a bit line of the cell. In the embodiment illustrated, the cell's bit lines are formed as doped regions 14 in the substrate. The sources of vertical transistors 71 are connected to the bit lines by bit line contacts 78 and 80, formed by dropping a contact to the underlying doped region 14. The drain regions of each vertical transistor, in other words the uppermost doped regions, are coupled to doped regions 52 and 54, which are the drain regions of the latch and pull-up transistors 73 and 75. Vss contacts 70 and 72 are made to doped regions 58, which function as source regions of the pull-up or load transistor. Vcc contacts 74 and 76 are made to doped regions 48, which function as source regions of the latch transistors. Thus, both the Vcc and Vss contacts are made to the horizontal epitaxial active areas labeled as active areas 42 and formed as described above in accordance with the present invention. Also illustrated in the layout of FIG. 11 are silicide straps 60, as discussed above, and buried contacts 64 and 65, discussed below.

FIG. 12 is a cross-sectional view of the SRAM cell of FIG. 11 taken along the line 12—12. The same elements as illustrated in FIG. 10 are illustrated in FIG. 12, thus a description of all the elements in FIG. 12 is not necessary. Furthermore, the same processing steps are used to achieve both structures illustrated in FIGS. 10 and 12, and steps not illustrated in FIGS. 1–10 (such as growing a field isolation region 81) are well known in semiconductor manufacturing, so that further process description is unnecessary. Also, corresponding elements in each of the figures are labeled similarly.

The cell as illustrated in FIG. 12 has two doped regions 14 which act as bit lines (BL and $\overline{BL}$). In the view of FIG. 12, the vertical transistors are both pass transistors having overlying horizontal epitaxial layer 42 which forms the latch and pull-up transistors as described in reference to FIG. 10. Also illustrated in FIG. 12 are buried contacts 64 and 65. Buried contact 64 is used to connect the drain of one vertical transistor 71 to the gate electrodes 44 and 45 of one set of latch and pull-up transistors, while buried contact 65 is used to connect the drain of the other vertical transistor 71 to gate electrodes 44 and 45 of the other set of latch and pull-up transistors. While traditionally buried contacts are formed at a first level of polysilicon within a semiconductor device, buried contacts 64 and 65 perform the same function as conventional buried contacts despite the fact that they are formed at a second level of polysilicon within IC 10 as illustrated in FIG. 12 (where the first level of polysilicon is conductive layer 18). The process used to form buried contacts 64 and 65 may be accomplished using processes similar to those used to form conventional buried contacts. After gate oxidation to form dielectric layer 43, polysilicon is deposited across the IC. Openings for buried contacts 64 and 65 are made be etching through the polysilicon and dielectric layer 43, to expose the underlying active area to be contacted (in this case current electrodes within the horizontal active area of transistors 73 and 75). An additional layer of polysilicon is then deposited to make contact to the exposed active area, as shown in FIG. 12, to form buried contacts 64 and 65. To avoid formation of a diode between either of buried contacts 64 and 65 and active area 42, area 42 may be silicided before depositing the polysilicon, resulting in silicide regions (not shown) between one or both buried contacts 64 and 65 and active area 42 as illustrated in FIG. 12. After formation of the buried contacts, exposed portions of gate dielectric layer 43 are removed and self-aligned silicidation is performed, in accordance with known techniques, to form salicide regions 60 on all exposed silicon and polysilicon areas (including the top surface of buried contacts 64 and 65 and gate electrodes 44 and 45 as illustrated in FIGS. 10 and 12).

Advantages of using vertical and horizontal transistors in an SRAM cell of the present invention include the following. Since all of the devices in the SRAM cell are constructed from single crystal silicon the cell stability, leakage current, and other performance should be much higher than an SRAM cell constructed with two or more polysilicon thin film transistors. For example, the carrier mobility of polysilicon is only 10–25 $cm^2$/V-sec whereas the mobility in single crystal CLSEG silicon is ten times higher, on the order of 200 $cm^2$/V-sec. Vertical silicon pillars and SOI silicon provide a much smaller cross-section for the interaction of cosmic rays and alpha particles with silicon (which produces a local burst of charge and a soft error event). Thus, the construction of MOS devices; as vertical pillars of silicon or as horizontal SOI devices should significantly improve the soft error rate of a circuit built with these devices. SOI construction should also significantly increase the speed of the horizontal. MOSFETs and hence of the circuit. Load devices of the cell, either in the form of transistors or resistors, are formed of single crystal silicon. Therefore, the devices are capable of carrying more current due to the higher mobility of single crystal silicon. Pass transistors of the cell are formed as vertical transistors having a surrounding gate, as illustrated in FIG. 6. The surrounding gate fully depletes and, in some cases, fully inverts the entire channel region. This greatly increases the device current drive. A latch transistor for the cell is formed in the horizontal active area as a silicon-on-insulator device, and thus has minimal parasitic capacitance. Because the extent of interconnects are significantly reduced, cell area is likewise significantly reduced. Using 0.25 μm lithography resolution, a cell using vertical and horizontal transistors as herein described may be on the order of 3.0 $\mu m^2$ in area. Also, topography within the cell is less severe than with other types of 3-D integration because the devices are inherently connected through the epitaxial growth process.

Figure 13:
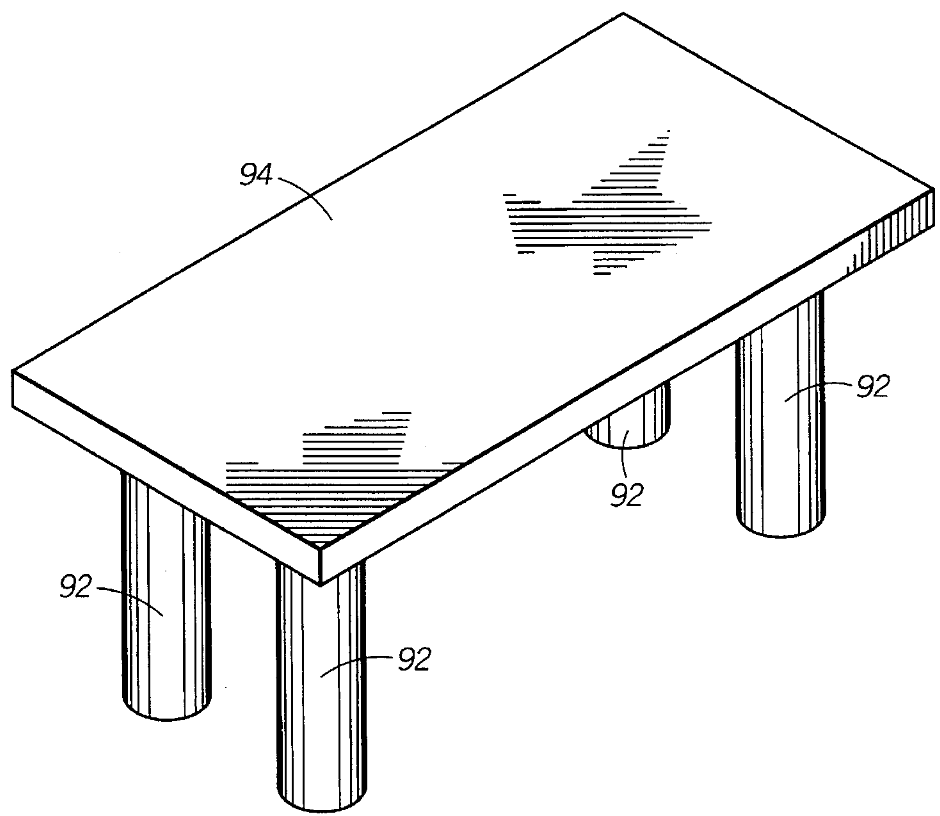
FIGS. 13–15 are perspective views demonstrating various ways in which vertical and horizontal devices may be combined in accordance with the present invention.
Figure 14:
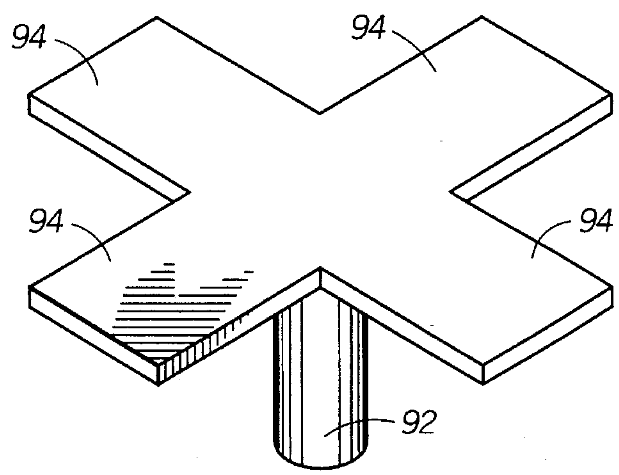
Figure 15:
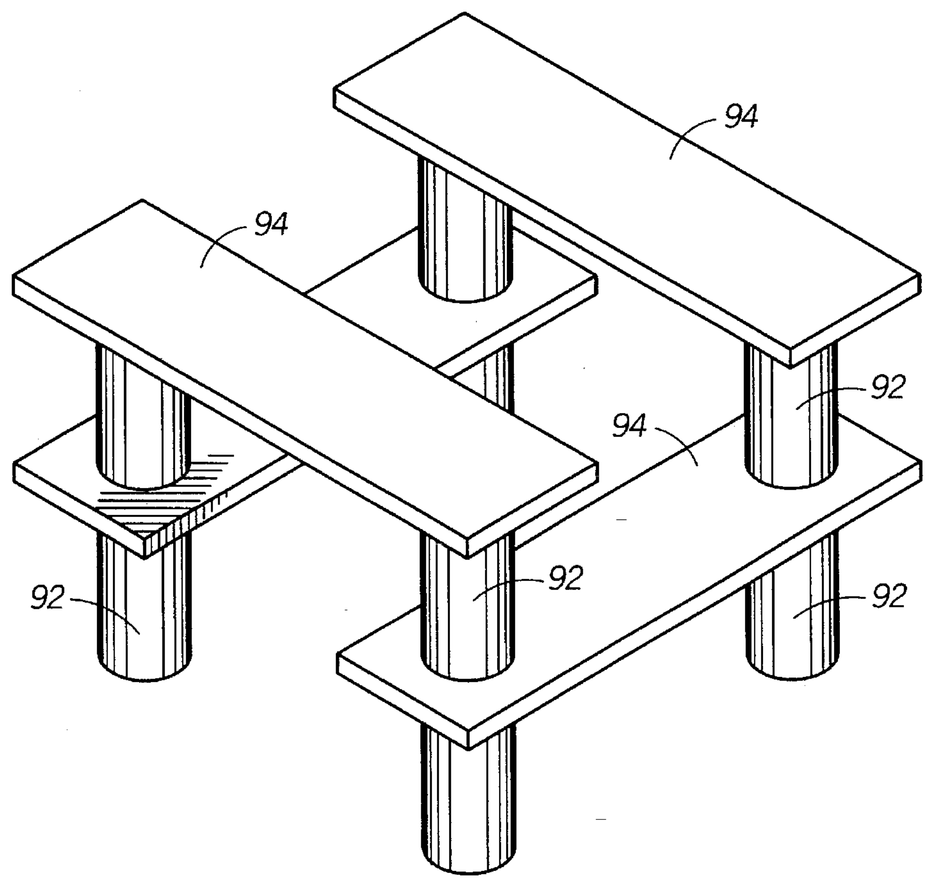

FIGS. 13–15 illustrate other advantages of the present invention which applies to all embodiments, namely the ability to extend active areas to various levels within an IC and the ability to inherently connect numerous active areas without the need for dedicated interconnects or contacts. FIG. 13 illustrates in a 3-D view how four vertical devices 92 may be formed in conjunction with one horizontal device 94, all of one continuous single crystal material. Note that only the epitaxially grown active areas are illustrated in FIGS. 13–15 to clearly portray the 3-D nature of the invention. Vertical devices 92 may be vertical transistors, such as the vertical transistors described above, or may be resistors, capacitors, or other active devices. Likewise, horizontal devices can be bipolar or MOS transistors, resistors, or capacitors. FIG. 14 illustrates in 3-D how four horizontal devices 94 can be formed on top of a single vertical device 92. Note that a multitude of horizontal devices could also be formed. FIG. 15 illustrates in 3-D how numerous levels of integration may be achieved by combining vertical devices 92 and horizontal devices 94 in a "scaffolding" type configuration, in accordance with embodiments of the present invention.

The foregoing description and illustrations contained herein demonstrate many of the advantages associated with the present invention. In particular, it has been revealed that both horizontal and vertical MOSFETs are used in concert to achieve a much greater packing density than is possible with either technology alone. Horizontal interconnect lengths are reduced by replacing traditional linear interconnect lines (such as polysilicon, metal, or silicide) by an active circuit element, i.e. a horizontal transistor. Vertical interconnect lengths are reduced by replacing traditional vertical interconnects (such as polysilicon, or metal plugs) by an active circuit element such as a vertical transistor. Active circuit elements are "folded" into closer proximity with one another as compared to integration schemes where all of the active transistors are made in the silicon substrate. Both horizontal and vertical transistors are fabricated in single crystal silicon for higher performance than polysilicon TFTs. The extent of integration (i.e. limit of the packing density) is limited only by the cumulative thermal budget of the selective epitaxial growth (SEG) steps. With low temperature SEG technology ($GeH_4$ prebake at 650° C., and SEG growth at 850° C.), many layers of devices could be fabricated. Both n-channel and p-channel devices can be combined (by the use of an ohmic strap such as a silicided plug). Nodes are formed directly between source and drain regions of MOSFETs without interconnect lines by an ohmic strap at the device junctions. Bipolar devices could also be integrated along with MOS structures, either vertically or horizontally. Moreover, because active areas for all devices are formed by SEG either as vertical MOSFETs or as SOI MOSFETs, traditional isolation schemes such as LOCOS and trench isolation may not be needed if the substrate is not used for interconnection or active circuitry since cross-talk would not be a concern.

In general, the three transistors 71, 73, and 75 illustrated in FIG. 10 results in six (three factorial) possible SRAM configurations. A first embodiment being that transistor 71 is an N-channel latch transistor wherein doped region 14 provides a ground potential, transistor 73 is an N-channel pass transistor wherein electrode 48 connects to a bit-line, and transistor 75 is a P-channel pull-up transistor wherein electrode 58 is coupled to a power supply conductor (typically providing a voltage within a range of roughly 1.5 volts to 5 volts). A second embodiment being that transistor 71 is an N-channel latch transistor wherein doped region 14 provides a ground potential, transistor 73 is a P-channel pull-up transistor wherein electrode 48 connects to a power supply conductor, and transistor 75 is an N-channel pass transistor wherein electrode 58 is coupled to a bit-line. A third embodiment being that transistor 71 is an N-channel pass transistor wherein doped region 14 functions as a bit-line, transistor 73 is a P-channel pull-up transistor wherein electrode 48 connects to a power supply conductor, and transistor 75 is an N-channel latch transistor wherein electrode 58 is coupled to a ground power supply conductor. A fourth embodiment being that transistor 71 is an N-channel pass transistor wherein doped region 14 functions as a bit-line, transistor 73 is an N-channel latch transistor wherein electrode 48 connects to a ground power supply conductor, and transistor 75 is a P-channel pull-up transistor wherein electrode 58 is coupled to a power supply conductor. A fifth embodiment being that transistor 71 is a P-channel pull-up transistor wherein doped region 14 functions as a bit-line, transistor 73 is an N-channel latch transistor wherein electrode 48 connects to a ground power supply conductor, and transistor 75 is an N-channel pass transistor wherein electrode 58 is coupled to a bit-line. A sixth embodiment being that transistor 71 is a P-channel pull-up transistor wherein doped region 14 functions as a bit-line, transistor 73 is an N-channel pass transistor wherein electrode 48 connects to a bit-line, and transistor 75 is an N-channel latch transistor wherein electrode 58 provides a ground potential. Furthermore, when using the fifth and sixth embodiments as discussed above the siliciding of electrodes 52 and 54 via silicide region 60 is not adequate in and of itself. The regions 52 and 54 must be etched to expose electrode 34 before salicidation or silicidation occurs to ensure that region 32 is electrically short-circuited to one or more of regions 52 and/or 54. In another form the diode formed via the contact of region 34 to regions 52 and 54 may be maintained but will result in a diode voltage drop (0.1 volts to 1.0 volts) within the storage node (regions 52, 54, and 32 collectively).

Thus, it is apparent that there has been provided, in accordance with the invention, an integrated circuit having both horizontal and vertical devices, and a process for making the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, it should be apparent to someone skilled in the art that vertical integration technology wherein vertical and horizontal devices are formed with single crystal epitaxial silicon, in accordance with the present invention, could be readily adapted to such applications as flash EEPROMs (electrically erasable programmable read-on-memories), other non-volatile memory products, DRAMs (dynamic RAMs), and high speed logic applications. Therefore, it is intended that this invention encompass all such variations and modifications as fall within the scope of the appended claims.

We claim:

1. An integrated circuit comprising:

a semiconductor substrate having a first active area formed of a single crystal semiconductor material;

a vertical device formed above the substrate and having a second active area vertically connected to the first active area, the vertical device having a first electrode and a second electrode within the second active area;

a dielectric layer formed above the substrate and adjacent at least a portion of the vertical device; and a horizontal device formed above the substrate, on the dielectric layer, and connected to the substrate by the vertical device, the horizontal device having a third active area and a third electrode and a fourth electrode within the third active area;

wherein the first, second, third, and fourth electrodes are formed of a continuous single crystal semiconductor layer of the semiconductor material and are connected to each other, and wherein the first, second, third, and fourth electrodes have a same conductivity type.

2. The integrated circuit of claim 1 wherein the second electrode of the vertical device overlies the first electrode of the vertical device within the integrated circuit.

3. The integrated circuit of claim 2 wherein the vertical device is a field effect transistor and wherein the first and second electrodes of the vertical device are drain and source electrodes.

4. The integrated circuit of claim 3 wherein the horizontal device is a field effect transistor, and wherein the third electrode of the horizontal device is a current electrode.

5. The integrated circuit of claim 1 wherein the semiconductor substrate comprises single crystal silicon, and wherein the second and third active areas comprise epitaxial single crystal silicon.

6. The integrated circuit of claim 1 wherein the horizontal device is a first horizontal device and further comprising a second horizontal device, wherein the second horizontal device overlies the first horizontal device and has a fourth active area and a fifth electrode within the fourth active area, and wherein the fifth electrode is formed of the continuous single crystal semiconductor layer of the first, second, third, and fourth electrodes.

7. The integrated circuit of claim 1 wherein the vertical device is a first vertical device and further comprising a second vertical device having a fourth active area vertically connected to the first active area and having a fifth electrode within the fourth active area, and wherein the fifth electrode is formed of the continuous single crystal semiconductor layer of the first, second, third, and fourth electrodes.

8. The integrated circuit of claim 1 wherein the horizontal device is a first horizontal device, and further comprising a second horizontal device formed within the third active area and substantially planar with the first horizontal device.

9. The integrated circuit of claim 8 wherein the first and second horizontal devices are transistors.

10. The integrated circuit of claim 9 wherein the vertical transistor and first and second horizontal transistors are transistors of a static random access memory cell.

11. An integrated circuit comprising:

a substrate of a single crystal semiconducting material and having a first active area;

a vertical transistor formed above the substrate and comprising:

a second active area; and a first and a second current electrode formed in the second active area, the second current electrode overlying the first current electrode, and the first and second current electrodes being separated by a channel region;

wherein the first current electrode is connected to the first active area;

a dielectric layer overlying the substrate and around at least a portion of the vertical transistor; and a horizontal transistor formed above the substrate and comprising:

a third active area formed on the dielectric layer;

a first and a second current electrode formed in the third active area, positioned approximately horizontally to one another, and separated by a channel region;

wherein the first current electrode of the horizontal transistor is connected to the second current electrode of the vertical transistor such that a voltage on the first current electrode of the horizontal transistor is substantially equal to that on the second current electrode of the vertical transistor;

wherein the second and third active areas are formed of a continuous single crystal semiconductor segment.

12. The integrated circuit of claim 11 wherein the substrate is comprised of single crystal silicon, and wherein the second and third active areas each comprise epitaxial silicon.

13. The integrated circuit of claim 12 wherein the vertical transistor comprises:

a stack comprising a first dielectric layer, a polysilicon layer, and a second dielectric layer, wherein the second dielectric layer is the dielectric layer on which the third active area is formed, wherein a hole is formed through all layers of the stack to create a sidewall of the polysilicon layer;

a control electrode dielectric adjacent the sidewall of the polysilicon layer within the hole; and a column of epitaxial silicon filling the hole, wherein a bottom portion of the column is the first current electrode, a top portion of the column is the second current electrode, and wherein the channel region lies between the top and bottom portions of the column;

wherein the polysilicon layer surrounding the hole serves as a control electrode of the vertical transistor.

14. The integrated circuit of claim 11 wherein the vertical transistor is a first vertical transistor, and further comprising a second vertical transistor formed above the substrate and comprising:

a fourth active area; and a first and a second current electrode formed in the fourth active area, the second current electrode overlying the first current electrode, and the first and second current electrodes being separated by a channel region;

wherein the first current electrode of the second vertical transistor is connected to the first active area, and wherein the fourth active area is formed of the single crystal semiconducting material of the substrate.

15. The integrated circuit of claim 11 wherein the horizontal transistor is a first horizontal transistor, and further comprising a second horizontal transistor formed within the third active area.

16. The integrated circuit of claim 15 wherein the first and second horizontal transistors are formed on opposing sides of the vertical transistor.

17. The integrated circuit of claim 11 wherein the vertical transistor is a pass transistor and the horizontal transistor is a latch transistor in a static random access memory cell.

18. An integrated circuit comprising:

a semiconductor substrate having a first active area;

a dielectric layer having an opening formed therein, the opening having a central axis perpendicular to the semiconductor substrate;

a vertical transistor formed in a second active area above the substrate, within the opening in the dielectric layer, and connected to the first active area, the vertical transistor having a first current electrode, a second current electrode above the first current electrode, and a first channel region separating the first and the second current electrodes;

a first horizontal transistor formed in a third active area on the dielectric layer and connected to the second active area, the first horizontal transistor extending in a first direction approximately perpendicular to the central axis of the opening and having a third current electrode, a fourth current electrode, and a second channel region separating the third and the fourth current electrodes; and a second horizontal transistor formed in the third active area on the dielectric layer, the second horizontal transistor extending in a second direction approximately perpendicular to the central axis of the opening, and having a fifth current electrode, a sixth current electrode, and a third channel region separating the fifth and the sixth current electrodes.

19. The integrated circuit of claim 18 wherein the first and the second horizontal transistors are substantially co-planar.

20. The integrated circuit of claim 18 wherein the first direction is approximately opposite the second direction.

21. The integrated circuit of claim 18 wherein the first channel region and the second channel region are offset from the opening in the dielectric.

22. An integrated circuit comprising:

a single crystal semiconductor substrate having a first active area;

a dielectric layer formed over the semiconductor substrate, the dielectric layer having a vertical sidewall and a top surface which meets the vertical sidewall;

a vertical transistor formed above the semiconductor substrate, having a second active area vertically connected to the first active area, and being adjacent the vertical sidewall of the dielectric layer, the vertical transistor having a first electrode and a second electrode within the second active area;

a horizontal transistor formed in a third active area connected to the second active area, the horizontal transistor having a third electrode, a fourth electrode, and a channel region separating the third electrode and the fourth electrode, wherein the third electrode, the: fourth electrode, and the channel region are formed on the top surface of the dielectric layer such that the channel region is offset from the vertical sidewall of the dielectric layer wherein the second and third active areas are formed of a continuous single crystal semiconductor segment.

* * * * *